OPTO-ELECTRONIC SEMICONDUCTOR DEVICE

Filed Aug. 13, 1965 3 Sheets-Sheet 1

INVENTORS
JULIAN R. A. BEALE
ANDREW F. BEER
PETER C. NEWMAN
BY Frank R. Trifari
AGENT Nov. 7, 1967 J. R. A. BEALE ETAL 3,351,828

OPTO-ELECTRONIC SEMICONDUCTOR DEVICE

Filed Aug. 13, 1965 3 Sheets-Sheet 2

INVENTORS
JULIAN R. A. BEALE
ANDREW F. BEER
PETER C. NEWMAN

BY Frank R. Trifari
AGENT

Nov. 7, 1967 J. R. A. BEALE ETAL 3,351,828

OPTO-ELECTRONIC SEMICONDUCTOR DEVICE

Filed Aug. 13, 1965 3 Sheets-Sheet 3

INVENTORS
JULIAN R. A. BEALE
ANDREW F. BEER
PETER C. NEWMAN
BY Frank R. Trifari
AGENT United States Patent Office 3,351,828

Patented Nov. 7, 1967

3,351,828

OPTO-ELECTRONIC SEMICONDUCTOR DEVICE

Julian Robert Anthony Beale, Reigate, Surrey, and Andrew Francis Beer and Peter Colin Newman, Crawley, Sussex, England, assignors to North American Philips Company, Inc., New York, N.Y., a corporation of Delaware Filed Aug. 13, 1965, Ser. No. 479,412
Claims priority, application Great Britain, Aug. 19, 1964, 33,875/64
10 Claims. (Cl. 317—235)

Figure 1:
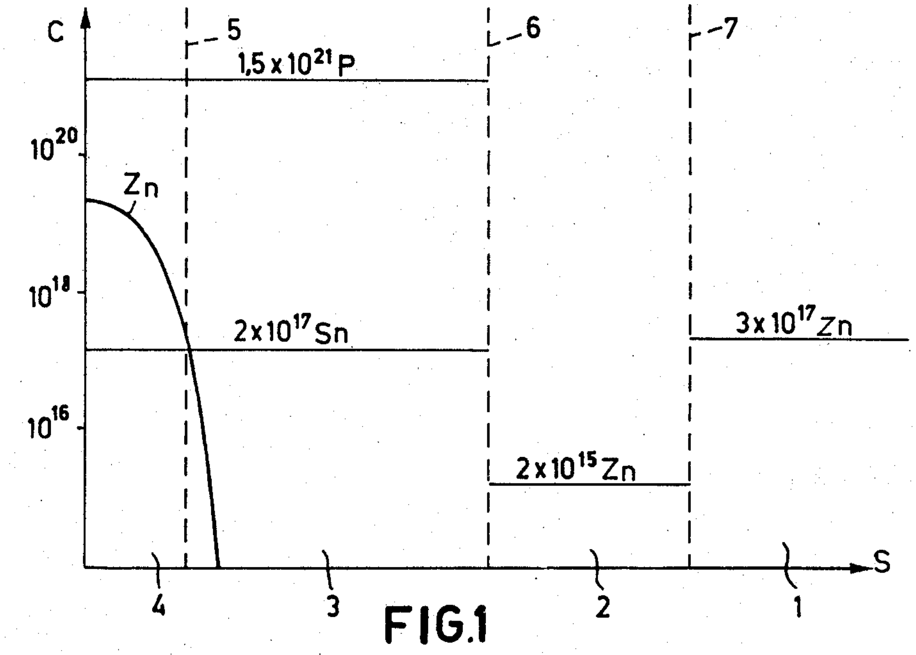

This invention relates to opto-electronic semi-conductor devices.

In co-pending patent application Ser. No. 336,336, filed Dec. 19, 1963, whose contents are hereby incorporated by reference there is described and claimed an opto-electronic semi-conductor device comprising a semiconductor body having a first, photon-emissive p-n junction capable of emitting photons with a quantum efficiency greater than 0.1 when suitably biased in the forward direction and a photo-sensitive part comprising a second, photo-sensitive p-n junction for transforming the energy of photons emanating from the first p-n junction to that of charge carriers when the second p-n junction is suitably biased in the reverse direction, the distance between the first p-n junction and the second p-n junction being at least one diffusion length from the first p-n junction of the charge carriers injected by that junction into the adjacent region of the body intermediate the first and second junctions. Such a device will hereinafter be referred to as an opto-electronic transistor. The regions of the body will be given the terms normally associated therewith in the transistor art. Thus, the region of the body intermediate the first and second junctions will be hereinafter referred to as the base region. The first junction will hereinafter be referred to as the emitter-base junction separating the base region from the emitter region and the second junction will be hereinafter referred to as the collector-base junction separating the base region from the collector region.

An opto-electronic transistor may generally have a PNP or NPN structure with a single connection to the region of the body intermediate the first and the second junctions, but in certain instances the structure may be such that more than one connection is made to the region of the body intermediate the first and second junctions, for example, when the intermediate region comprises a high resistivity part serving to electrically isolate the junctions. The principle of small signal operation of a p-n-p opto-electronic transistor is as follows:

The emitter-base junction is forward biased to obtain a region of excess carrier concentration each side of this junction. The semiconductor material and impurity content are chosen such that a large proportion of the hole-electron pairs recombine with the emission of photons.

The collector-base junction is reverse biased to obtain a depletion region. Hole-electron pairs are liberated in the depletion region by the photons emitted from the first junction which reach the depletion region and the hole-electron pairs are rapidly separated by the field, the holes flowing to the collector and the electrons to the base.

The input signal modulates the emitter-base current. This change in current produces a change in the number of photons emitted. The change in collector-base current follows the change in emitter-base current and the $\alpha_0$ of the opto-electronic transistor may approach unity if certain conditions are satisfied. Most of the photons emitted should reach the depletion region of the collector-base junction and be absorbed therein and converted into current with a quantum efficiency approaching unity. The effective angular distribution of photons generated in the vicinity of the emitter-base junction should preferably be adjusted to direct most of the photons towards the collector-base junction. The effective angular distribution is determined by the initial distribution of light from the emission region and by reflection and refraction. To obtain an $\alpha_0$ approaching unity, for example 0.95, less than about 1% of the emitted photons can be allowed to escape from the semiconductor body. To achieve this it has been found necessary in certain instances to deposit a reflective coating on the surface of the body, for example when the structure of the opto-electronic transistor is such that the junctions are arranged opposite and parallel to each other.

According to the invention in an opto-electronic transistor the collector-base junction surrounds the emitter-base junction within the semiconductor body and the collector-base junction and the emitter-base junction both terminate only in a common surface of the semiconductor body.

This arrangement of the junctions in the opto-electronic transistor has the advantage, inter alia, that most of the emitted photons only travel a short distance before reaching the collector-base junction and only a small amount of the emitted light is lost by absorption in the semiconductor body and emission from the semiconductor body.

The emitter-base junction and the collector-base junction may both terminate only in a common plane surface of the semiconductor body. Such an arrangement can be conveniently realised by use of known techniques in the semiconductor art.

A major part of the emitter-base junction may be substantially parallel to a major part of the collector-base junction. With this arrangement of the junctions absorption of the emitted photons within the semiconductor body may be kept very low.

In an opto-electronic transistor according to the invention in which the emitter-base junction and the collector-base junction both terminate only in a common plane surface of the semiconductor body and in which the major parts of the junctions are substantially parallel, these major parts may be substantially parallel to the common plane surface of the semiconductor body.

In the previously referred to known structure of the opto-electronic transistor in which the junctions are arranged opposite and parallel to each other, to achieve efficient collection of the photons emitted by the emitter-base junction it is necessary to construct the device with the collector-base junction having an area significantly greater than that of the emitter-base junction. Thus it is calculated, for example, if the emitter-base junction is of area $40\mu$ x $40\mu$ and the junctions are spaced apart by $15\mu$, in order that at least 75% of the emitted photons shall be capable of being collected in the vicinity of the collector-base junction then the area of this junction must be at least $160\mu$ x $160\mu$, that is sixteen times the area of the emitter-base junction. In the opto-electronic transistor according to the invention the area of the collector-base junction may be less than four times, or even three times, the area of the emitter-base junction.

An opto-electronic transistor according to the invention may comprise a layer of insulating material on the common surface at least at the areas of the common surface where the junctions terminate, at least two openings in the insulating layer exposing underlying regions of the semiconductor body and material in the openings forming ohmic contacts to the respective regions. This device has the advantage that the arrangement of the junctions according to the invention may be readily achieved by similar techniques to those known per se in the semiconductor art such as the so-called planar technique used in the manufacture of double diffused silicon transistors.

In a preferred form of the invention the emitter and base regions of the opto-electronic transistor according to the invention are of material epitaxially deposited in a cavity extending into the body, but not through the body, from the common surface. In this device the collector region contains a conductivity type determining impurity element characteristic of one type, the material epitaxially deposited in the cavity contains a conductivity type determining impurity element characteristic of the opposite type and the emitter region in the epitaxially deposited material may contain a conductivity type determining impurity element characteristic of the one type diffused therein.

The semiconductor material of the emitter and base regions epitaxially deposited in the cavity may be of higher energy gap than the material of the semiconductor body adjacent the cavity forming the collector region. Such an arrangement in which the collector-base junction is a semiconductor heterojunction, which is also broadly described in the said copending application Ser. No. 336,-336 has the advantage that efficient absorption of the emitted photons may be achieved due to the material of the collector region of lower energy gap having a smaller absorption length for the emitted photons than that of the material of higher energy gap of the emitter and base regions through which emitted photons travel without absorption.

One such above described device may comprise a substantially uniform concentration of the conductivity type determining impurity element characteristic of the opposite type throughout the epitaxially deposited material such that the collector-base junction lies substantially at the interface between the epitaxially deposited semiconductor material and the material of the body of lower energy gap. Alternatively in a further form the collector-base junction may lie within the semiconductor material of lower energy gap substantially parallel to and spaced from the interface between the two semiconductor materials. With this construction the collector-base junction may conveniently be spaced from the interface such that the depletion layer on both sides of the junction may lie within the lower energy gap material. This leads to more efficient absorption of photons since the depletion layer on the side of the junction within the base region is now also situated in the lower energy gap material in which the absorption length is small.

An opto-electronic transistor according to the invention may comprise a body of gallium arsenide.

In an opto-electronic transistor according to the invention in which material of the higher energy gap is epitaxially deposited in the cavity, the material of the body adjacent to the cavity forming the collector region may be gallium arsenide and the material epitaxially deposited in the cavity may be gallium arseno-phosphide. In this device the conductivity type determining impurity element characteristic of the one type in the collector region may be, for example zinc or cadmium, the conductivity type determining impurity element characteristic of the opposite type in the epitaxially deposited material may be, for example, tin or silicon, and the conductivity type determining impurity element characteristic of the one type in the emitter region may also be, for example, zinc or cadmium.

In a further form of the opto-electronic transistor according to the invention, the collector region may contain a conductivity type determining impurity element characteristic of one type and the base and emitter regions may respectively contain conductivity type determining impurity elements characteristic of the opposite type and the one type diffused in order of succession into the semiconductor body from the common surface. Such a device may readily be manufactured by techniques known in the semiconductor art, for example, when the device comprises an insulating layer on a common plane surface in which the junctions terminate, the emitter and base region may be formed by diffusing the conductivity type determining impurity elements through apertures formed in the insulating layer which acts as a mask to prevent unwanted diffusion of elements into the remainder of the body. Such a technique is commonly employed in the manufacture of so-called planar double diffused transistors. In a preferred form of this device the semiconductor material of the emitter and base regions is of higher energy gap than the semiconductor material of the collector region, for example the collector region is of gallium arsenide, and the emitter and base regions are of gallium arseno-phosphide. The material of higher energy gap for example, gallium arseno-phosphide may be epitaxially deposited on the material of the lower energy gap, for example gallium arsenide. Alternatively in this device, in which the emitter and base regions are of gallium arseno-phosphide and the collector region is of gallium arsenide, the emitter and base regions may consist of gallium arseno-phosphide formed by diffusion of phosphorous into the body from the common surface, the body initially consisting of gallium arsenide. Again this structure may be readily achieved using an insulating layer, for example of silicon oxide, as a diffusion mask when forming the emitter and base regions subsequent to the phosphorous diffusion.

In the opto-electronic transistor in which the emitter and base regions are formed by diffusion of the conductivity type determining impurity elements from the common surface, the collector-base junction may be arranged to lie within the material of the lower energy gap parallel to and spaced from the boundary of the semiconductor materials of different energy gap. This may be achieved by control of the diffusion of the conductivity type determining impurity element of the opposite type such that the collector-base junction is located, for example, beyond the interface of the gallium arseno-phosphide and gallium arsenide when the gallium arseno-phosphide is formed by epitaxial deposition, or beyond the depth of the diffused phosphorus when the gallium arseno-phosphide is formed by diffusion of phosphorus from the common surface.

The opto-electronic transistor may comprise a substrate of lower resistivity semiconductor material having higher resistivity semiconductor material epitaxially deposited thereon within which the emitter-base and collector-base junctions are present.

Figure 4:
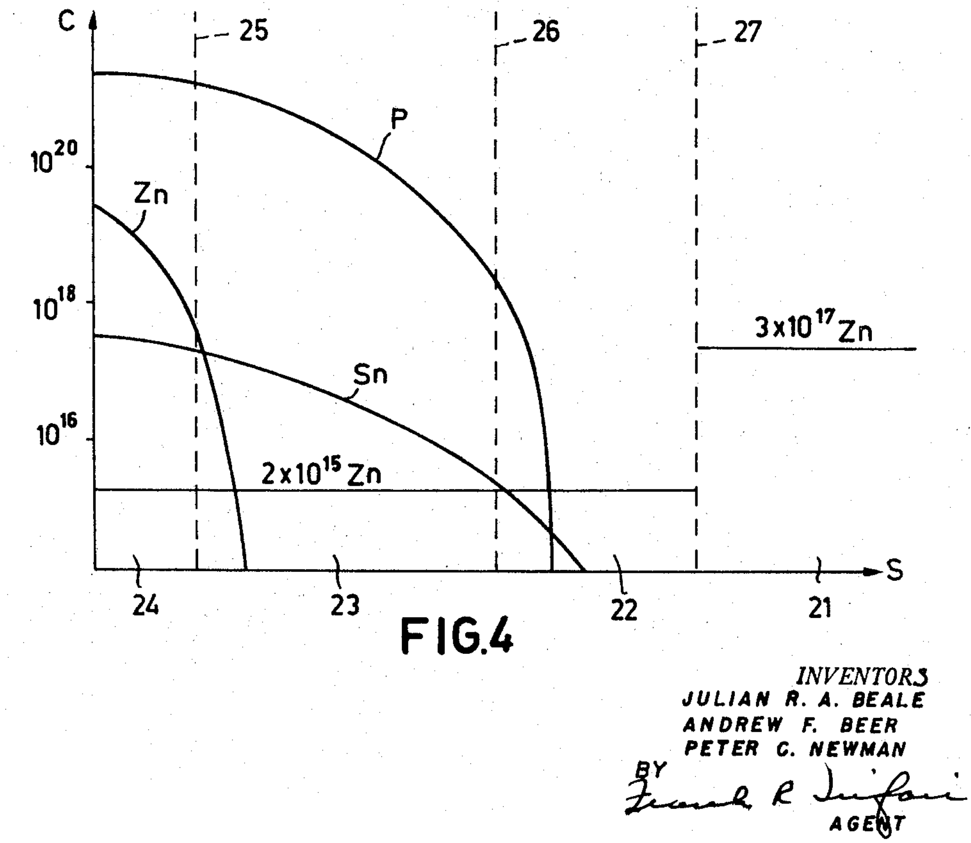
Figure 2:
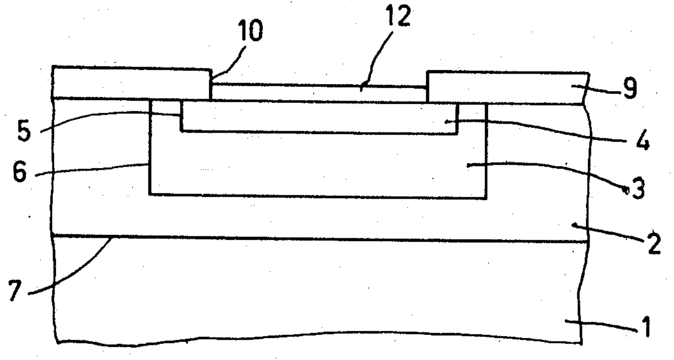
Figure 3:
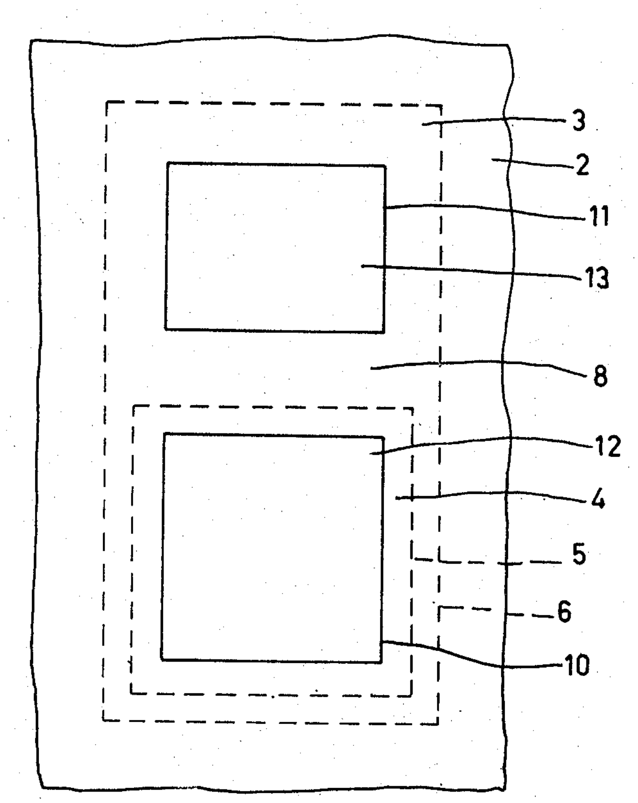
Figure 5:
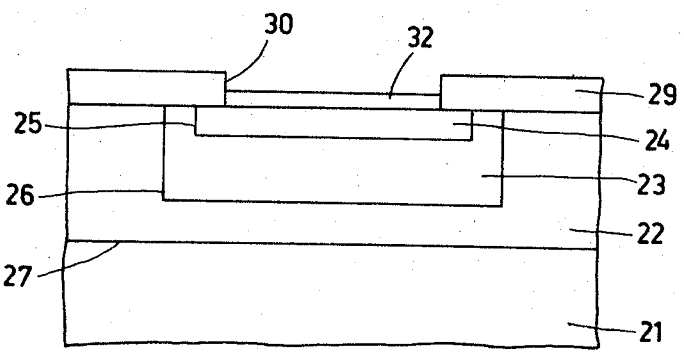
Figure 6:
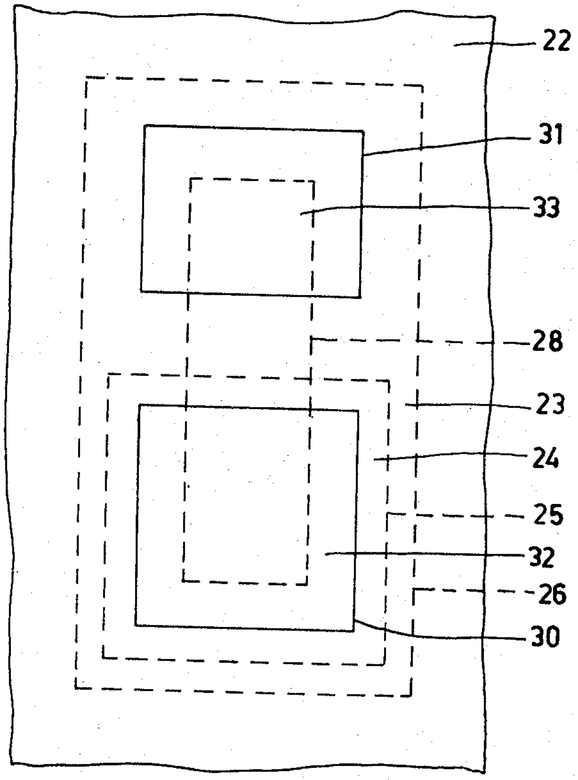

Two embodiments of the invention will now be described, by way of example, with reference to the diagrammatic drawings accompanying the Provisional Specification in which:

FIGURE 1 is a graph showing the concentration of impurity centres in the semiconductor body of a first embodiment of an opto-electronic transistor, FIGURE 2 is a section through part of the opto-electronic transistor of FIGURE 1 during a stage of manufacture prior to attachment of leads to the various regions of the semiconductor body, FIGURE 3 is a plan view of the opto-electronic transistor part shown in FIGURE 2, FIGURE 4 is a graph showing the concentration of impurity centres in the semiconductor body of a second embodiment of an opto-electronic transistor, FIGURE 5 is a section through part of the opto-electronic transistor of FIGURE 4 during a stage of manufacture prior to attachment of leads to the various regions of the semiconductor body; and FIGURE 6 is a plan view of the opto-electronic transistor part shown in FIGURE 5.

In FIGURES 1 and 4 the impurity concentrations C are represented as ordinates on a logarithmic scale and the distances S in the semiconductor body are represented as abscissae on a linear scale.

The opto-electronic transistor of FIGURES 1 to 3 consists of a semiconductor body having a low resistivity $p^+$ substrate 1 of gallium arsenide with a uniform acceptor concentration of zinc of about $3\times10^{17}$ atoms/cc., a higher resistivity p-type collector region 2 of gallium arsenide epitaxially deposited on the substrate 1 and having a uniform acceptor concentration of zinc of $2\times10^{15}$ atoms/cc., an n-type base region 3 of gallium arseno-phosphide having a uniform donor concentration of tin of $2\times10^{17}$ atoms/cc., a p-type emitter region 4 of gallium arseno-phosphide having an acceptor concentration of zinc of not more than $3\times10^{19}$ atoms/cc., at the surface of the region, an emitter-base junction 5 and a collector-base junction 6. The p-n junctions 5 and 6 are represented in FIGURES 1 and 3 by broken lines and the interface between the substrate 1 and the region 2 is represented by a broken line 7 in FIGURE 1.

The base region 3 consists of gallium arseno-phosphide having a uniform concentration of phosphorus of $1.5\times10^{21}$ atoms/cc., epitaxially deposited in a cavity 8 (FIGURE 3) formed in the epitaxially deposited collector region 2 of gallium arsenide and the emitter region 4 is formed by diffusion of zinc into the epitaxially deposited gallium arseno-phosphide so that the emitter-base junction and the collector-base junction both terminate only in the common plane surface of the regions 2, 3 and 4 of the body and the emitter-base junction is surrounded by the collector-base junction within the semiconductor body. The dimensions of the $p^+$ gallium arsenide substrate are 1 mm. x 1 mm. x 3 mm. thickness, the epitaxially deposited collector region 2 has a thickness of about 30$\mu$ the collector base junction 6 corresponds to the extremity of the cavity 8 formed in the region 2 and has a depth in the region of about 20$\mu$ and the emitter-base junction 5 is at a depth of 5$\mu$ within the epitaxially deposited gallium arseno-phosphide. The area of the major part of the collector base junction lying parallel to the interface 7 between the collector region 2 and the substrate 1 and parallel to the common plane surface of the regions 2, 3 and 4 in which both junctions terminate is $110\mu\times60\mu$ and the corresponding area of the emitter-base junction is $50\mu\times50\mu$. The upper common plane surface of the body in which the junctions terminate has an insulating masking layer of silicon oxide 9 deposited thereon with two windows 10 and 11 in the layer 9 in which ohmic contacts 12 and 13 to the emitter and base regions respectively are situated.

The opto-electronic transistor shown in FIGURES 1 to 3 is manufactured as follows:

A single crystal body of low resistivity gallium arsenide having zinc as acceptor impurity in a concentration of about $3\times10^{17}$ atoms/cc. in the form of a slice 1 cm. x 1 cm. is lapped to a thickness of 3 mm. to form a substrate 1 and polished so that it has a damage free crystal structure and an optically flat finish on one of its larger surfaces. The starting material being a slice of 1 cm.$^2$ will yield a plurality of the described devices by carrying out subsequent steps in the manufacture using suitable masks such that a plurality of isolated devices are formed in the single slice which are later separated by dicing but the method will now be described with reference to the formation of each isolated device, it being assumed that where masking, diffusion, etching and associated steps are referred to then these steps are simultaneously carried out for each isolated device on the single slice prior to dicing.

A layer of p-type gallium arsenide of 30$\mu$ thickness is epitaxially grown by deposition from the vapour phase on the prepared surface of the substrate 1 to form a collector region 2. The gallium arsenide layer is formed at 750° C. by the reaction of gallium and arsenic, the gallium being produced by the disproportionation of gallium monochloride and the arsenic being produced by the reduction of arsenic trichloride with hydrogen. Simultaneously with the deposition of the gallium arsenide zinc is deposited such that in the epitaxially grown layer there is a uniform concentration of zinc of $2\times10^{15}$ atoms/cc.

A masking layer of silicon oxide is now grown on the surface of the epitaxially deposited gallium arsenide by the reaction of dry oxygen and tetra-ethyl silicate at a temperature of 350–450° C. The slice is laid horizontally on a pedestal so that no silicon oxide is deposited on the lower surface of the low resistivity substrate.

A photosensitive resist layer is applied to the surface of the silicon oxide masking layer and with the aid of a mask is exposed such that an area of 110$\mu$ x 60$\mu$ is shielded from the incident radiation. The unexposed part of the resist layer is removed with a developer so that a window 110$\mu$ x 60$\mu$ is formed in the resist layer. The underlying oxide layer exposed by the window is now etched with a fluid consisting of a solution of 25% ammonium fluoride and 3% hydrofluoric acid in water. Etching is carried out until a window 110$\mu$ x 60$\mu$ is formed in the oxide masking layer. The photosensitive resist layer is then removed from the remainder of the surface of the oxide layer by softening in trichlorethylene and rubbing. Suitable resist materials and developers are known and available commercially.

The body is now etched so that a cavity is formed in the epitaxially deposited gallium arsenide layer 2 at a position corresponding to the window in the oxide layer. Etching is continued until a cavity 8 of 20$\mu$ depth in the epitaxially deposited p-type layer is formed. A suitable etchant is 3 parts concentrated $HNO_3$, 2 parts $H_2O$ and 1 part HF (40%) used at 40° C., the etching rate being approximately 1 $\mu$/sec. The oxide masking layer is subsequently removed by dissolving in the above described solution of ammonium fluoride and hydrofluoric acid in water. The original surface of the epitaxially deposited gallium arsenide layer 2 now having the 20$\mu$ cavity therein is prepared for further epitaxial deposition by etching briefly in the nitric acid and hydrofluoric acid solution described above but used at room temperature.

The prepared body is placed in a tube and an n-type layer of gallium arseno-phosphide is epitaxially grown on the surface of the previously grown epitaxial layer 2 of gallium arsenide. The gallium arseno-phosphide layer is formed at 750° C. by the reaction of gallium with arsenic and phosphorus. The gallium is produced by the disproportionation of gallium monochloride and the arsenic and phosphorus are produced by the reduction of their trichlorides with hydrogen. The phosphorus content in the epitaxially grown solid solution gallium arseno-phosphide layer is $1.5\times10^{21}$ atoms/cc. Simultaneous with the deposition of the gallium arseno-phosphide tin is deposited such that in the epitaxially grown layer there is a uniform concentration of tin of $2\times10^{17}$ atoms/cc. The epitaxial layer grown follows the contour of the surface and growth is continued until the layer is of such a thickness that the epitaxially grown layer of gallium arseno-phosphide fills the cavity and extends over the region of the cavity a few microns beyond the original surface of the epitaxially deposited gallium arsenide layer 2.

After the epitaxial deposition, the body is removed from the tube and a metal disc coated with dental wax is placed in contact with the reverse side of the body. Material is removed from the exposed surface of the body consisting of the epitaxially deposited layer of gallium arseno-phosphide by polishing until the surface becomes flat and lies a few microns below the original surface of the epitaxially grown layer 2 of gallium arsenide. By the use of suitable staining techniques the original surface of the epitaxially grown layer 2 of gallium arsenide may be located and the polishing halted thereafter accordingly. By this removal of the gallium arseno-phosphide layer there remains a body as is shown in FIGURES 2 and 3 consisting of a $p^+$ substrate having a p-type epitaxial layer 2 of nearly 30$\mu$ thickness with a cavity 8 extending nearly 20$\mu$ from the upper surface into this layer and containing gallium arseno-phosphide 3 epitaxially grown on the gallium arsenide. The interface 6 between the gallium arseno-phosphide and the gallium arsenide corresponds to the extremity of the cavity 8 and will be the location of the collector-base junction of the opto-electronic transistor.

The surface of the body is given a light cleaning etch in a solution of methanol and bromine before a masking layer 9 of silicon oxide is grown on the prepared surface of the body by the reaction of dry oxygen and tetraethyl silicate at a temperature of 350–450° C. The body is laid horizontally on a pedestal so that no oxide is deposited on the lower surface.

A photosensitive resist layer is applied to the surface of the silicon oxide masking layer 9 and with the aid of a mask is exposed such that an area situated above the gallium arseno-phosphide epitaxially deposited in the cavity and of dimensions 40$\mu$ x 40$\mu$ is shielded from the incident radiation. The unexposed part of the layer is removed with a developer so that a window 40$\mu$ x 40$\mu$ is formed in the resist layer. The body is etched to form a window 10 (FIGURE 3) 40$\mu$ x 40$\mu$ in the silicon oxide masking layer 9 at a position below the window in the resist layer. The etchant is the ammonium fluoride and hydrofluoric acid solution described above for removing the previously formed silicon oxide masking layer.

The photoresist remaining on the surface of the silicon oxide masking layer 9 is removed by softening in trichlorethylene and rubbing. The body is now placed in a sealed silica tube containing zinc and excess arsenic and phosphorus and zinc is diffused into the gallium arseno-phosphide region 3 by heating the tube to 900–1,000° C.

The diffusion of zinc is controlled such that the emitter base junction of the opto-electronic transistor lies at a distance of 5$\mu$ from the surface of the region 3 where the concentration is $3\times10^{19}$ atoms/cc.

Ohmic contact to the p-type emitter region is made by evaporating gold containing 4% zinc over the entire upper surface of the body. The source is held at 800–1,000° C., the body at room temperature and the evaporation is continued for not more than 1 minute, so that the gold 4% zinc contact layer 12 is deposited on the emitter surface in the window 10.

The amount of gold/zinc evaporated over the upper surface is such as to be insufficient to fill the window 10 and the filling is thereafter effected with a protective lacquer of Cerric Resist. The remainder of the gold/zinc on the upper surface of the body is now removed by a solution of 40 g. KI, 10 g. I and 250 g. $H_2O$.

A fresh photosensitive resist layer is applied to the surface and, with the aid of a mask, exposed such that a second area 40$\mu$ x 30$\mu$ situated above the gallium arseno-phosphide epitaxially deposited in the cavity is shielded from the incident radiation. The unexposed part of the photosensitive resist layer is removed so that a further window 40$\mu$ x 30$\mu$ is formed in the resist layer. The body is etched to form a window 11 (FIGURE 3), 40$\mu$ x 30$\mu$ in the silicon oxide masking layer 9 at a position below the window formed in the resist layer. The same etchant is used as is used to form the window 10 in the silicon oxide masking layer. The lacquer of Cerric Resist in the window 10 above the evaporated gold/zinc contact is not attacked by the etchant. The window 11 exposes the base region 3 of gallium arseno-phosphide and ohmic contact to this region is made by evaporating gold containing 4% tin over the whole upper surface of the body so that a gold 4% tin contact layer 13 is deposited in the window 11 in the silicon oxide layer. The amount of gold/tin evaporated over the upper surface is such as to be insufficient to fill the window 11 and the filling is thereafter effected with a protective lacquer of Cerric Resist. The remainder of this gold/tin layer on the upper surface of the body is removed with the exposed portion of the photosensitive resist layer, by softening this in trichlororethylene and rubbing.

The protective lacquer of Cerric Resist in the windows 10 and 11 above the gold/zinc and gold/tin layers respectively is removed by dissolving in acetone.

The body is placed in a furnace and heated to 500° C. for 5 minutes to alloy the gold/zinc and gold/tin contact layers 12 and 13 respectively to the emitter and base region respectively.

A reflective layer of gold (not shown in the figures), may now be selectively applied to the surface of the oxide layer to form a mirror at the periphery of the emitter-base junction. This may be carried out by applying a photosensitive resist layer to the entire surface and, with the aid of a mask, exposing the resist layer so that a narrow strip above the periphery of the emitter-base junction is shielded from the incident radiation. The unexposed part of the photosensitive resist layer is removed so that a window corresponding to the narrow strip is formed in the resist layer. Gold is then evaporated over the entire upper surface of the body so that in the window formed in the resist layer a reflective gold layer is deposited on the silicon oxide layer. The evaporated gold on the remainder of the surface is then removed with the exposed portion of the photosensitive resist layer by softening this in trichlorethylene and rubbing. The slice is now diced up into individual pieces 1 mm. x 1 mm. each comprising an opto-electronic transistor assembly. A molybdenum strip is soldered to the $p^+$ substrate 1 with a bismuth/2% silver alloy or a bismuth /5% cadmium alloy.

Leads are then secured to the gold and tin contacts 12 and 13 to the emitter and base regions respectively by thermo-compression bonding gold wires thereto. The assembly with leads so attached is then given a final etch in a fluid of 3 parts concentrated $HNO_3$, 2 parts $H_2O$ and 1 part HF (40%) used at room temperature. The assembly is then encapsulated as is desired.

The opto-electronic transistor of FIGURES 4 to 6 consists of a semiconductor body having a low resistivity $p^+$ substrate 21 of gallium arsenide with a uniform acceptor concentration of, for example, zinc of about $3\times10^{17}$ atoms/cc., a high resistivity p-type collector region 22 of gallium arsenide epitaxially deposited on the substrate 21 and having a uniform acceptor concentration of, for example, zinc of about $2\times10^{15}$ atoms/cc., an n-type base region 23 of gallium arseno-phosphide, a p-type emitter region 24 of gallium arseno-phosphide, an emitter-base junction 25 and a collector base junction 26. The p-n junctions 25 and 26 are represented in FIGURE 4 by broken lines and the interface between the substrate 21 and the region 22 is represented by a broken line 27 in FIGURE 4.

The emitter and base regions consist of a solid solution gallium arseno-phosphide formed by diffusion of phosphorus into the epitaxially deposited region 22 of gallium arsenide. The phosphorus concentration at the emitter-base junction 25 is about $1.5\times10^{21}$ atoms/cc. The collector-base junction 26 is formed by diffusion of the donor tin or other suitable donor material into the gallium arseno-phosphide region previously formed by the phosphorus diffusion, the concentration of tin or other suitable donor material at the surface of the emitter region being $5\times10^{17}$ to $10^{18}$ atoms/cc. The emitter-base and collector-base junctions both terminate only in the common plane surface of the regions 22, 23 and 24 of the body, the emitter-base junction 25 being surrounded by the collector-base junction 26 within the semiconductor body. The emitter-base junction 25 is formed by diffusion of the acceptor zinc or other suitable acceptor material into the gallium arseno-phosphide, the concentration at the junction being 2.5 to $5.0\times10^{17}$ atoms/cc., and the concentration at the surface of the emitter region being not more than $3\times10^{19}$ atoms/cc. The dimensions of the p+ gallium arsenide substrate 21 are 1 mm. x 1 mm. x 3 mm. thickness, the epitaxially deposited collector region 22 has a thickness of about 30μ, the collector base junction 26 is at a depth in the region 22 of about 20μ and the emitter-base junction 25 is at a depth of 5μ within the gallium arseno-phosphide. The area of the major part of the collector-base junction 26 lying parallel to the interface 27 between the collector region 22 and the substrate 21 and parallel to the common plane surface of the regions 22, 23 and 24 in which both junctions terminate is 110μ x 60μ and the corresponding area of the emitter-base junction is 50μ x 50μ. The upper common plane surface of the body in which the junctions terminate has an insulating masking layer of silicon oxide 29 thereon with two windows 30 and 31 in the layer 29 in which ohmic contacts 32 and 33 to the emitter and base regions respectively are situated.

An opto-electronic transistor shown in FIGURES 4 to 6 is manufactured as follows:

A body of low resistivity gallium arsenide having zinc as an acceptor impurity in a concentration of about $3\times10^{17}$ atoms/cc., in the form of a slice 1 cm. x 1 cm. is lapped to a thickness of 3 mm. to form a substrate 21 and polished so that it has a damage free crystal structure and an optically flat finish on one of its larger surfaces. The starting material again being a slice of 1 cm.$^2$ will likewise yield a plurality of isolated devices in the single slice and similarly the method will be described with reference to the formation of each isolated device in the slice.

A layer of p-type gallium arsenide of 30μ thickness is epitaxially grown by deposition from the vapour phase on the prepared surface of the substrate 21 to form a collector region 22. The gallium arsenide layer is formed at 750° C. by the reaction of gallium and arsenic, the gallium being produced by the disproportionation of gallium monochloride and the arsenic being produced by the reduction of arsenic trichloride with hydrogen.

A masking layer of silicon oxide is now grown on the surface of the epitaxially deposited gallium arsenide by the reaction of dry oxygen and tetra-ethyl silicate at a temperature of 350–450° C. The slice is laid horizontally on a pedestal so that no silicon oxide is deposited on the lower surface of the low resistivity substrate.

A photosensitive resist layer is applied to the surface of the oxide masking layer situated above the surface of the epitaxially grown region 22, and with the aid of a mask is exposed such that an area of 70μ x 20μ is shielded from the incident radiation. The unexposed part of the resist layer is removed with a developer. Suitable resist materials and developers are known and available commercially. In certain instances it may be advantageous to harden the remaining previously exposed resist layer by baking. The body is now etched so that a window 28 is formed in the silicon oxide masking layer. A suitable etchant is 25% ammonium fluoride, 3% hydrofluoric acid in water.

The body is now placed in a sealed silica vessel and phosphorus is diffused into the epitaxially grown region 22 through the window 28 in the masking layer of silicon oxide which acts to prevent diffusion of phosphorus into the remaining parts of the body. The diffusion is carried out at 900–1,100° C. with sufficient phosphorus in the vessel to give a vapour pressure between 1 and 10 atmospheres during the diffusion.

After completing the phosphorus diffusion, tin or other suitable donor material is diffused into the body at the same location through the window 28 to form the collector-base junction 26 (FIGURE 3) at a depth of about 20μ from the surface of the epitaxially grown region 22. The body together with tin or other suitable donor material and excess arsenic and phosphorus is sealed in a silica tube. The tube is heated at 1,100° C. for 25 hours, longer or shorter according to the donor material chosen. The body is removed from the tube and a further silicon oxide masking layer 29 (FIGURE 2) is grown on the body by the reaction of dry oxygen and tetra-ethyl silicate at a temperature of 350–450° C. The body is again laid horizontally on a pedestal so that no oxide is deposited on the lower surface of the substrate. The growth is carried out to fill in the window 28 and the surface of the regrown silicon oxide layer is polished flat afterwards.

A photosensitive resist layer is applied to the surface of the silicon oxide masking layer 29 and with the aid of a mask is exposed such that an area situated above the diffused region 23 of n-type gallium arseno-phosphide of dimensions 40μ x 40μ is shielded from the incident region. The unexposed part of the resist layer is removed with a developer so that a window of 40μ x 40μ is formed in the resist layer. The body is now etched to form a window 30 (FIGURE 6) 40μ x 40μ in the silicon oxide masking layer 29 at a position below the window in the resist layer. The etchant is the ammonium fluoride and hydrofluoric acid solution described above for etching the window in the first formed silicon oxide masking layer.

The photoresist remaining on the surface of the silicon oxide masking layer 29 is removed by softening in trichlorethylene and rubbing. The body is now placed in a sealed silica tube with zinc or other suitable acceptor material, excess arsenic and phosphorus and zinc or the other suitable acceptor material is diffused into the gallium arseno-phosphide region 23 through the window 30 in the masking layer to form a p-type emitter region 24 by heating the tube to 900–1,000° C.

The diffusion of zinc or other suitable acceptor material is controlled such that the emitter-base junction lies at a distance of 5μ from the surface of the region 23 where the concentration is $10^{18}$ to $3\times10^{19}$ atoms/cc., and the acceptor concentration at the emitter-base junction is 2.5 to $5.0\times10^{17}$ atoms/cc., where the phosphorus content of the gallium arseno-phosphide is $1.5\times10^{21}$ atoms/cc.

Ohmic contact to the p-type emitter region is made by evaporating gold containing 4% zinc over the entire surface of the body. The source is held at 800–1,000° C., and the evaporation is continued for not more than one minute so that a gold 4% zinc contact layer 32 is deposited on the emitter surface in the window 30.

The amount of gold/zinc evaporated over the upper surface is such as to be insufficient to fill the window 30 and the filling is thereafter effected with a protective lacquer of Cerric Resist. The remainder of the gold/zinc on the upper surface of the body is now removed by a solution of 40 g. KI, 10 g. I and 250 g. $H_2O$.

A fresh photosensitive resist layer is applied to the surface and, with the aid of a mask, exposed such that an area 40μ x 30μ situated above the diffused gallium arseno-phosphide region 23, but remote from the area at which zinc diffusion was performed, is shielded from the incident radiation. The unexposed part of the photosensitive resist layer is removed so that a further window 40μ x 30μ is formed in the resist layer. The body is etched to form a window 31 (FIGURE 6) 40μ x 30μ in the silicon oxide masking layer 29 at a position below the window formed in the resist layer. The same etchant is used as is used to form the window 30 in the silicon oxide masking layer. The lacquer of Cerric Resist in the window 30 above the evaporated gold contact is not attacked by the etchant. The window 31 exposes the base region 23 of gallium arseno-phosphide and ohmic contact to this region is made by evaporating gold containing 4% tin over the whole upper surface of the body so that a gold/4% tin contact layer 33 is deposited in the window 31 in the silicon oxide layer. The amount of gold/tin evaporated over the upper surface is such as to be insufficient to fill the window 31 and the filling is thereafter effected with a protective lacquer of Cerric Resist. The remainder of the gold/tin on the upper surface of the body is removed with the exposed portion of the photosensitive resist layer by softening this in trichloroethylene and rubbing.

The protective lacquer of Cerric Resist in the windows 30 and 31 above the gold/zinc and gold/tin layers respectively is removed by dissolving in acetone. The body is placed in a furnace and heated to 500° C. for 5 minutes to alloy the gold/zinc and gold/tin layers 32 and 33 respectively to the emitter and base regions respectively.

A reflective layer of gold (not shown in the figures) may now be selectively applied to the surface of the oxide layer to form a mirror at the periphery of the emitter-base junction. This may be carried out by applying a photosensitive resist layer to the entire layer to the entire surface and, with the aid of a mask, exposing the resist layer so that a narrow strip above the periphery of the emitter-base junction is shielded from the incident radiation. The unexposed part of the photosensitive resist layer is removed so that a window corresponding to the narrow strip is formed in the resist layer. Gold is then evaporated over the entire upper surface of the body so that in the window formed in the resist layer a reflective gold layer is deposited on the silicon oxide layer. The evaporated gold on the remainder of the surface is then removed with the exposed portion of the photo-sensitive resist layer by softening this trichlorethylene and rubbing.

The slice is now diced up into individual pieces 1 mm. x 1 mm. each comprising an opto-electronic transistor assembly.

A molybdenum strip is soldered to the $p^+$ substrate 21 with a bismuth/2% silver alloy or a bismuth/5% cadmium alloy.

Leads are then secured to the gold and tin contacts 32 and 33 to the emitter and base regions respectively by thermo-compression bonding gold wires thereto. The assembly with leads so attached is then given a final etch in a fluid of 3 parts concentrated $HNO_3$, 2 parts $H_2O$ and 1 part HF (40%) used at room temperature. The assembly is then encapsulated as is desired.

In both of the embodiments described the acceptor concentration in the substrate is $3\times10^{17}$ atoms/cc. and acceptor concentration at the surface of the emitter region is $3\times10^{19}$ atoms/cc. In order to keep the absorption of photons as low as possible in the emitter region the concentration at the surface of the region is preferably lower for example, $3\times10^{17}$ atoms/cc. of zinc. However in order to prevent unwanted diffusion of the acceptor element present in the substrate during diffusion and epitaxial deposition it is preferable that the acceptor concentration in the substrate should not be higher than that to be finally obtained at the surface of the emitter region. This particularly applies when the acceptor element in the substrate is the same as the element diffused to form the emitter region. Another possible method of preventing unwanted diffusion and yet maintaining a higher aceptor concentration in the substrate is to use an element having a slower diffusion coefficient, such as, for example, manganese as the conductivity determining impurity element in the substrate.

What is claimed is:

1. An opto-electronic device comprising a semiconductor body having photon-emitting and photon-collecting, spaced, p-n junctions, said photon-emitting junction being operable when biased in the forward direction to emit photons with a quantum efficiency greater than 0.1, means for biasing said photon-emitting junction in the forward direction to cause the emission of photons toward the photon-collecting junction, and means for biasing said photon-collecting junction in the reverse direction to establish in a body portion adjacent the photon-collecting junction a depletion field for collecting charge carriers generated upon absorption within the body of the emitted photons, the spacing between the photon-emitting and photon-collecting junctions being at least one diffusion length at operating temperature for charge carriers injected by the photon-emitting junction into the semiconductor body regions lying intermediate the junctions, said photon-emitting junction lying adjacent a plane surface of the semiconductor body and extending only to said surface, said photon-collecting junction completely surrounding the photon-emitting junction in the bulk and extending only to the same said surface of the semiconductor body, thereby improving the efficiency of collection of the emitted photons.

2. An opto-electronic device as set forth in claim 1 wherein the area of the photon-collecting junction is less than about four times the area of the photon-emitting junction.

3. An opto-electronic device as set forth in claim 1 wherein the said surface of the semiconductor body is plane, the major part of the photon-emitting junction is plane and substantially parallel to the said plane surface, and the major part of the photon-collecting junction is also plane and substantially parallel to the plane major part of the photon-emitting junction.

4. An opto-electronic device as set forth in claim 3 wherein a layer of insulating material is provided on said same surface of the semiconductor body, said insulating layer having openings therein overlying the body regions between the photon-emitting junction and the surface and the intermediate body region, and ohmic contacts being provided to said body regions through the said openings.

5. An opto-electronic device comprising a monocrystalline semiconductor body of one conductivity type having in a surface thereof a cavity extending only partially into the depth of said body, a monocrystalline region filling said cavity and epitaxially related to the monocrystalline body, contiguous zones of opposite type conductivity material in said monocrystalline region forming emitter and base zones and a photon-emitting, p-n junction, said photon-emitting junction being operable when biased in the forward direction to emit photons with a quantum efficiency greater than 0.1, a collector zone in said body forming with said body zone a second p-n photon-collecting junction spaced from the photon-emitting junction, means for biasing said photon-emitting junction in the forward direction to cause the emission of photons toward the collecting junction, and means for biasing said photon-collecting junction in the reverse direction to establish in a body portion adjacent the photon-collecting junction a depletion field for collecting charge carriers generated upon absorption within the body of the emitted photons, the spacing between the photon-emitting and photon-collecting junctions being at least one diffusion length at operating temperature for charge carriers injected by the photon-emitting junction into the semiconductor body regions lying intermediate the junctions, said photon-emitting junction lying adjacent said surface of the semiconductor body and extending only to said surface, said photon-collecting junction completely surrounding the photon-emitting junction in the bulk and extending only to the same said surface of the semiconductor body, thereby improving the efficiency of collection of the emitted photons.

6. An opto-electronic device as set forth in claim 5 wherein the original semiconductor body is of semiconductor material having a given energy gap, and the epitaxial monocrystalline region is of semiconductor material having a larger energy gap than said given energy gap of the body.

7. An opto-electronic device as set forth in claim 6 wherein the collecting junction lies substantially at the interface of the materials of different energy gap.

8. An opto-electronic device as set forth in claim 6 wherein the lower energy gap material is gallium arsenide, and the higher energy gap material is gallium-arsenophosphide.

9. An opto-electronic device as set forth in claim 8 wherein the gallium arsenide contains in a collector zone an acceptor impurity of zinc or cadmium.

10. An opto-electronic device as set forth in claim 8 wherein the gallium arseno-phosphide contains a donor impurity of tin or silicon.

References Cited

UNITED STATES PATENTS

| | | | |
|---|---|---|---|
| 3,229,104 | 11/1966 | Rutz | 250—211 |
| 3,249,473 | 5/1966 | Holonyak | 148—175 |
| 3,283,207 | 11/1966 | Klein | 315—326 |

OTHER REFERENCES

Electronic Design, Mar. 29, 1963, article "GaAs Leading to New Class of Optical Devices."

IBM Technical Disclosure Bulletin, vol. 6, No. 5, page 7, October 1963, article by F. H. Dili.

Radio-Electronics, June 1963, pages 8 and 12, article, "Electro-Optical Amplifier," work performed by Rutz.

JOHN W. HUCKERT, *Primary Examiner.*

M. EDLOW, *Assistant Examiner.*